United States Patent [19]
Blazic et al.

[11] Patent Number: 5,184,516
[45] Date of Patent: Feb. 9, 1993

[54] CONFORMAL CIRCUIT FOR STRUCTURAL HEALTH MONITORING AND ASSESSMENT

[75] Inventors: Ernest S. Blazic, Hawthorne; Robert A. Bueker, Anaheim Hills; Lynn O. Waters, Hermosa Beach; William D. Farwell, Thousand Oaks; Joseph P. Smalanskas, Westchester, all of Calif.

[73] Assignee: Hughes Aircraft Company, Los Angeles, Calif.

[21] Appl. No.: 738,389

[22] Filed: Jul. 31, 1991

[51] Int. Cl.⁵ ............................................. G01N 19/08
[52] U.S. Cl. ........................................ 73/799; 73/767; 324/718
[58] Field of Search .................. 73/799, 862.68, 767, 73/769, 772, 862.67; 324/718

[56] References Cited

U.S. PATENT DOCUMENTS

| | | | |
|---|---|---|---|
| 4,546,652 | 10/1985 | Virkar et al. | 73/799 X |
| 4,835,466 | 5/1989 | Maly et al. | 324/718 X |
| 5,086,652 | 2/1992 | Kropp | 73/767 |

*Primary Examiner*—Jerry W. Myracle
*Attorney, Agent, or Firm*—L. A. Alkov; W. K. Denson-Low

[57] ABSTRACT

A strain, crack and acoustic emission conformal structural health monitoring circuit with integral preprocessor and provisions for connectorization to a central processing system includes a strain gauge (11) having crack sensing traces (21), (23), and (25) sandwiched between a bottom layer (13) and a top layer (39). Strain gauge (11) is attached to an aircraft structural surface (51) to be monitored. Successive alternating layers of interconnecting sheet layers (61) and dielectric layers (63) joined by successive layers of non-structural adhesive (65) are added sufficient to effectively attenuate any stress forces, and forces directly from the strain and cracks, from traveling upward from the aircraft structural surface (51). A metalization layer (47) tops the successive layers and supports an integrated circuit (43) which may be multi-chip hybrid package, discretely packaged components or conformally coated chip/circuit assemblies, and provides a means of interconnect to and protection from the ambient environment.

20 Claims, 2 Drawing Sheets

CONFORMAL CIRCUIT FOR STRUCTURAL HEALTH MONITORING AND ASSESSMENT

BACKGROUND OF THE INVENTION

1. Field of the Invention

The invention is related to in-service sensors for detecting, locating and assessing strain, crack, deformation and internal void characteristics of a composite or metallic structure.

2. Description of Related Art

Typically, structural support members placed in service are subjected to structural static and dynamic loads which result in measurable strain. Static, fatigue and impact service loads may eventually produce permanent deformation and/or cracks in metallic structures, and cracks and/or internal voids in composite structures over the life of the support. Deformation, stressing and degradation of the molecular structure occur during the life of the support members throughout the volume of its structure. An accurate ascertainment of the state of any physical support at any given time usually requires testing of the structural member and/or a microscopic view of a cross section of the structural member. Costly ground based non-destructive test methods such as X-Ray, eddy current and ultrasound inspections do not provide adequate information on the integrity of all sections of interest or a cost effective method to do so on a periodic basis.

However, it has been shown that defects occurring within a structural member are related to surface defects and acoustic emission at the surface, and therefore an analysis of defects and acoustic emission at the surface should provide a satisfactory indication of the integrity of the structural member. A visual examination of the surface of a structural member typically requires the in situ location of microscope devices and the ability to physically reach and prepare the surface being observed.

The surfaces which are structurally known to experience the greatest amount of stress under loading conditions will contain cracks, voids and permanent deformation which may not be in an accessible location. In addition, the time and effort and regularity required for human surface assessment is highly prohibitive of surface measurement, which is dangerous when the structure is not replaced after the onset of defects, and yet wasteful when the structural member is replaced based upon an average or mean time between failure analysis.

In response to these physical and economic considerations, some strain and crack sensors have been formulated which perform local area stress evaluation over a large area. Existing acoustic emission sensor technology has been developed which inherently provides large area coverage using passive and active monitoring signal processing techniques. Crack, strain and acoustic emission sensors would be integrated with supporting electronics on a conformal circuit which transmit processed structural characteristics to a central processing location for measurement and analysis. Current strain and crack gauge technology is limited to small area gauge clusters with no provisions for connectorization to external systems or interconnection to collocated signal processing hardware. Current acoustic emission sensor technology is limited to discrete sensor packages with collocated signal amplification with no provisions for multiple sensor configurations or collocated signal processing hardware. This general scheme is somewhat burdensome and necessitates the extension of a large number of interconnects transmitting unprocessed data at high data rates to a central location. What is needed is a conformal circuit capable of mounting with crack, strain and acoustic emissions sensors which has the bulk of the optical and/or electrical interconnects at the site of the conformal circuit for ease of installation. Electrical interconnects at the conformal circuit will accommodate existing strain, crack and acoustic emission sensor technology, whereas embedded photonic interconnects are envisioned for emerging optical sensor technology, signal processing and data bus transmission. Such a circuit would perform sensing analysis locally and only transmit a summary of the significant conditions at the sensors through a set of optical and/or electrical data lines to a central processor for further evaluation.

SUMMARY OF THE INVENTION

The invention is directed to a strain, crack and acoustic emission conformal structural health monitoring circuit with integral preprocessor and provisions for connectorization to a central processing system. The demonstrated embodiment focuses on flexible circuit technology used to create electrical interconnects, and electrical strain/crack sensors in situ to a flexible conformal circuit. The demonstrated embodiment of the invention is directed to a strain and crack sensor which has a number of lengths of small planar conductors, or traces, between two layers of flexible dielectric material. One set of planar conductor traces may be arranged in differing orientations to monitor stress, through strain and cracks produced thereby, in different directions. Strain causes the conductors to undergo cross sectional area changes resulting in resistance changes thereby indicating the severity of the strain. A second set of planar serpentine conductors have differing uniform cross sectional areas. Increasing stresses developed in the second set of planar serpentine conductor traces due to widening cracks will result in sequential failure of the second set of planar serpentine conductors in order of their cross sections from smallest to largest, thereby indicating the severity of the crack. Different planar strain and crack gauge orientations may be used in lieu of the serpentine gauges used in the demonstrated embodiment.

DESCRIPTION OF THE PREFERRED EMBODIMENTS

Figure 1:
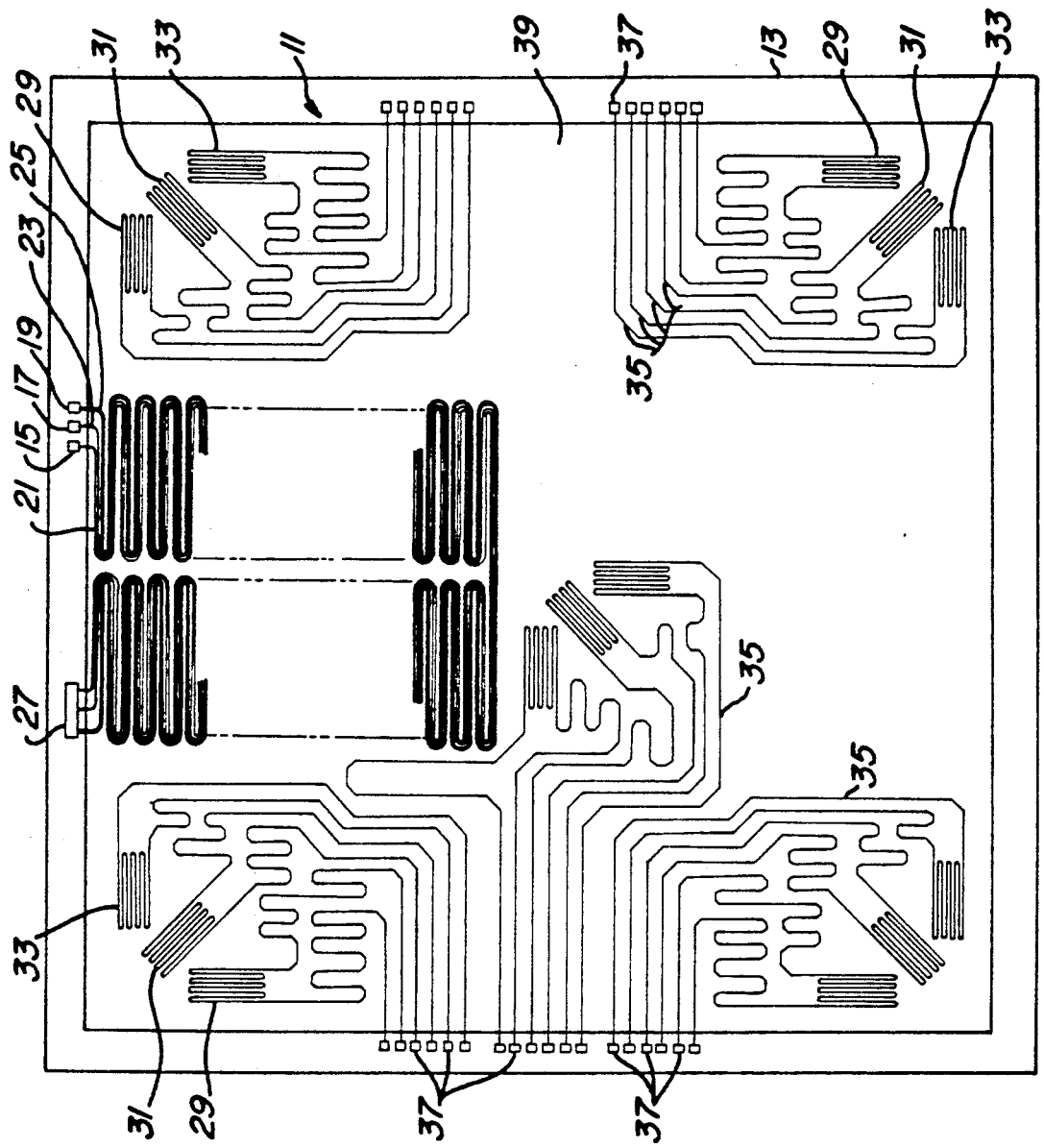
FIG. 1 is a plan view of the strain and crack gauge of the present invention illustrating layout of the conductors.

The demonstrated embodiment of the invention is directed to a strain and crack sensor which has a series of conductor traces, hereinafter referred to as traces, sandwiched between two layers of planar dielectric. Since the two layers are planar, conductors sandwiched therebetween will also have a planar orientation. Referring to FIG. 1, a top view of the strain and crack sensor of the present invention is illustrated and generally designated by the numeral 11. Dielectric material bottom layer 13 may be generally translucent, and very thin, and although not visually realizable in FIG. 1, is made up of two layers.

Near the center of the boundary of the dielectric material bottom layer 13 is a set of three separate terminals numbered 15, 17, and 19. To the three separate terminals numbered 15, 17, and 19 are connected conductors, or traces 21, 23, and 25. Ideally, each of the traces 21, 23, and 25 will be of uniform cross section throughout its respective length, but the cross sectional area (e.g., width) of each trace will be different.

The traces 21, 23, and 25, a short distance from their connection with terminals 15, 17, and 19, begin their extension in an adjacent orientation. In this adjacent orientation, they continue their extension in a serpentine manner, gradually approaching the center of the dielectric bottom layer 13. Just before reaching the center of dielectric bottom layer 13, the serpentine extension of traces 21, 23 and 25 moves laterally over, and a serpentine path is taken in a generally reverse path, back toward the edge of the dielectric bottom layer 13.

As the traces 21, 23, and 25 approach the edge of dielectric bottom layer 13, they terminate in an end terminal 27. In the case of these crack detecting traces, it is the continuity of each trace which is the important parameter. Therefore, joining their ends in a common terminal 27 will still enable the selective continuity between terminals 15, 17, and 19, and terminal 27, respectively.

With regard to these crack detection traces, FIG. 1 illustrates three such traces 21, 23, and 25, but any number may be used. Here, the serpentine extension over a wide area of the dielectric bottom layer 13 provides a wider physical area of crack coverage. The generally serpentine pattern provides for maximum crack sensitivity in the direction transverse to the predominant longitudinal extension of the serpentine path. Here, the maximum sensitivity of detection would be for those cracks having an orientation perpendicular to the longitudinal orientation of the elongated serpentine traces 21, 23 and 25. Different planar conductor trace geometries for strain and crack sensing may also be used, in lieu of the serpentine gage geometry.

Also referring to FIG. 1, a series of three sets of serpentine strain sensing conductors or traces 29, 31, and 33 are shown clustered together for form five clusters and physically appear to have a high density. The clusters are located near each of the four corners of dielectric bottom layer 13 and one is located nearer the middle of dielectric bottom layer 13. Each of the traces 29, 31, and 33 have the same resistance, and each has a pair of lead lines 35. Lead lines 35 each extends to an associated terminal 37 at the edge of dielectric bottom layer 13. Each of the lead lines 35 meanders between their associated terminal 37 and one end of their associated strain sensing traces 29, 31, and 33.

The meandering extension is for the purpose of insuring that each of the traces 29, 31, and 33, have the same resistance, and will likewise present the same resistance with respect to their associated terminals 37 at the edge of the dielectric bottom layer 13. Since the resistance per unit length of both the serpentine strain sensing traces 29, 31, and 33, and the lead lines 35 are known with precision, the predetermined lengths used for both will similarly enable the production of a strain and crack sensor having a pairs of terminals 37 having virtually identical resistances. The meandering of the lead lines 35 are to accommodate the longer lead lines which have a relatively shorter distance between its associated strain sensing traces 29, 31, and 33, and its terminal 37.

Finally, the dielectric bottom layer 13 is covered by a dielectric top layer 39. Note that the dimensions of dielectric top layer 39 are less than those of dielectric layer bottom layer 13 to allow exposure of the terminals 15, 17, 19, 27, and 37. In this manner, these terminals may be freely accessed by a connector.

In FIG. 1, each of the serpentine strain sensing traces 29, 31, and 33, has a generally longitudinal orientation. Orientation is, even for a serpentine trace, the direction in which the trace extends for the majority of its length. The general longitudinal orientation is in the sense of an axis rather than the direction along that axis to which the trace extends with reference to one end. The law of sines and cosines dictates the degree of strain sensed in a longitudinally extending serpentine trace. A strain whose force is co-axial with the longitudinally extending serpentine trace will produce the maximum degree of stretching of the trace. A strain whose force is perpendicular with respect to the longitudinally extending serpentine trace will produce the minimum degree of stretching of the trace, usually at the situs of the 180° turn. As a result, each of the serpentine strain sensing traces 29, 31, and 33 are oriented 45° apart from the axis of the adjacent trace. This arrangement will allow maximum detection of strain occurring in the two orthogonal axes and along an axis halfway in between. For strains having an axis not directly aligned with one of the three serpentine strain sensing traces 29, 31, and 33, the local strain will be detected by two or more of them simultaneously but to a lesser extent.

The specifics of one of the possible sizes of the dielectric bottom layer 13, top layer 39 and the serpentine traces 21, 23, 25, 29, 31, 33, and leads 35 are as follows: The trace and masking art work for a 7 inch square one layer circuit was formulated based on specific design requirements. However, circuit size can be larger or smaller depending on the specific design requirements. In the demonstrated embodiment, the trace width and trace spacing between traces 21, 23, 25, 29, 31, 33 are greater than or equal to 0.007 inches. However, trace spacing and width dimensions can be larger or smaller depending on specific design requirements and alternate manufacturing processing capabilities. In the demonstrated embodiment, traces 29, 31, 33 are made from Inconnel 600, a known alloy having a composition comprising about 80% nickel, about 16% chromium, and about 7% iron. However, other metal alloys or pure metals may be used depending on the specific design requirements and manufacturing processing capabilities.

Masking patterns for copper plating on the Inconnel should have a minimum 0.015 inch overlap to insure the selected coverage. However, the overlap will vary from process to process. In the demonstrated embodiment, an Inconnel 600 foil about 0.001 inches thick was attached to the bottom flexible dielectric layer also known as kapton, which was about 0.001 inches thick, using a thermosetting epoxy adhesive having an adhesive thickness of about 0.001 inches thick. However, different conductive metal, flexible dielectric, and adhesive materials and thicknesses may be specified depending on the specific design requirements. Metalization may also be applied to the bottom layer by deposition process for thin metal films.

In one embodiment, Inconnel 600 foil was etched to form the cluster patterns shown in FIG. 1. A copper metalization of about 0.001 inches was plated over selected areas before or after circuit etching, to reduce trace impedance from the strain sensing serpentine traces 29, 31, 33 through their traces 35 to their associated terminals 37, and between planar crack sensing traces 21, 23, and 25 and terminals 15, 17, and 19, respectively. Other plating materials and thicknesses may also be used depending on specific design requirements.

After etching and plating processes are complete a protective dielectric top layer 39 which is also about 0.001 inches thick is attached using acrylic adhesive about 0.001 inches thick. This protective dielectric top layer 39 should accommodate and leave uncovered all of the terminals 15, 17, 19, 37 and 27 about the edges of the flexible bottom layer 13. Other top layer dielectric and adhesive thicknesses and materials may also be used depending on specific design requirements.

A resistance of about 250 to about 450 ohms is preferable between the terminals 37 of a given strain sensing serpentine trace 29, 31, or 33. The best resistance value to use, however is about 350 ohms.

Figure 2:
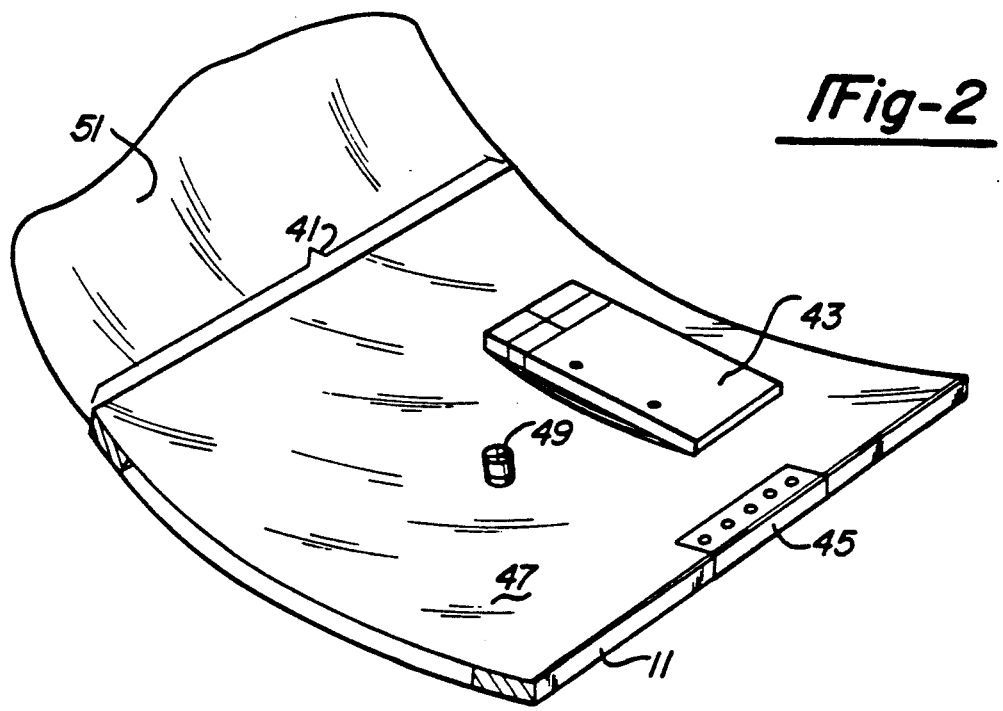
FIG. 2 is a perspective view illustrating the Conformal Circuit for Structural Health Monitoring system of the present invention in position and measurement.

Referring to FIG. 2, a perspective view of a completed Conformal Circuit for the Structural Health Monitoring system 41 of the present invention is shown in place. The bottom of the monitoring system 41 contains the strain and crack gauge 11. The apparent thickness of the structure to which the strain and crack gauge is attached is due to the buildup of successive layers of dielectric and interconnect layers (to be discussed below). Atop the Conformal Circuit for Structural Health Monitoring system 41 is an integrated circuit 43 which includes, among other things, a continuity indicator circuit. The integrated circuit 43 may be of several types which include but are not limited to the following types: multi-chip hybrid package, discretely packaged components or conformally coated chip/circuit assemblies. Integrated Circuit 43 packaging must provide a means of interconnect to the system 41 and protection from the ambient environment. The input terminals of the integrated circuit 43 are in communication with both the planar strain sensing traces 29, 31 and 33, and the planar crack sensing traces 21, 23 and 25 of FIG. 1 and the acoustic emission device 49 of FIGS. 2 and 3.

The completed Conformal Circuit for Structural Health Monitoring system 41 of the present invention as shown in FIG. 2 has several additional features. An area along the edge of the system 41, designated by the numeral 45 is an input/output area for receipt of power, fiber optic data or other interpanel interconnects for connecting several gauge systems 41 together or to a central data receiving location.

A metalization layer 47 over the top flex dielectric layer 39 may also be added to system 41 to shield the integrated circuitry 43 and traces 29, 31, 33, 21, 23 and 25 contained in the conformal circuit from the inductance of electromagnetic interference that may be present in an ambient environment, as shown in FIG. 2. The system 41 conformal flex circuit may also contain additional metalization traces to interconnect one or more acoustic emission emitter/receiver devices 49, as shown in FIG. 2, for passively detecting and locating acoustic emission during periods of crack and void initiation and growth, or for an active interrogation of the structure between two or more acoustic emission devices located on one or more of the Conformal Circuit for Structural Health Monitoring system 41. Acoustic emission devices 49 are typically made from piezoelectric crystals and films that are designed for either broad band or narrow band frequency response. The frequency response for a narrow band (aka resonant) piezoelectric sensor can be tailored to meet specific design requirements, whereas a broadband acoustic sensor would address a broader range of design requirements.

The integrated circuit 43, shown in FIG. 2, would contain additional signal conditioning components, such as amplifiers and filters to support the acoustic emission devices. A more advanced integrated circuit 43 would be required to support acoustic emission time and/or frequency domain signal preprocessing functions. This advanced system may be used to help quantify structural anomalies, including cracks and voids, occurring within or outside the boundaries of the Conformal Circuit for Structural Health Monitoring system 41. System 41 is advantageous in the event that it is possible to alert the operator that stress levels and crack/void initiation and/or growth in the structure under load is reaching critical levels in real time. A more advanced system could utilize this data for real time, adaptive control to limit the performance envelope, including the loading profile of a structure, until repairs can be made. System 41 is also advantageous in that it is possible to alert maintenance crews to the location and severity of cracks and voids such that structural repairs can be performed during periodic maintenance intervals on the affected structure as these anomalies approach a critical size. The critical size of the structured defect which would trigger structural repair depends on the material and load path as well as the anticipated stress levels and fatigue cycles for a specific structure. The integral connector interface 45 would be used to interface with a real time or periodic maintenance system for structural repairs.

Figure 3:
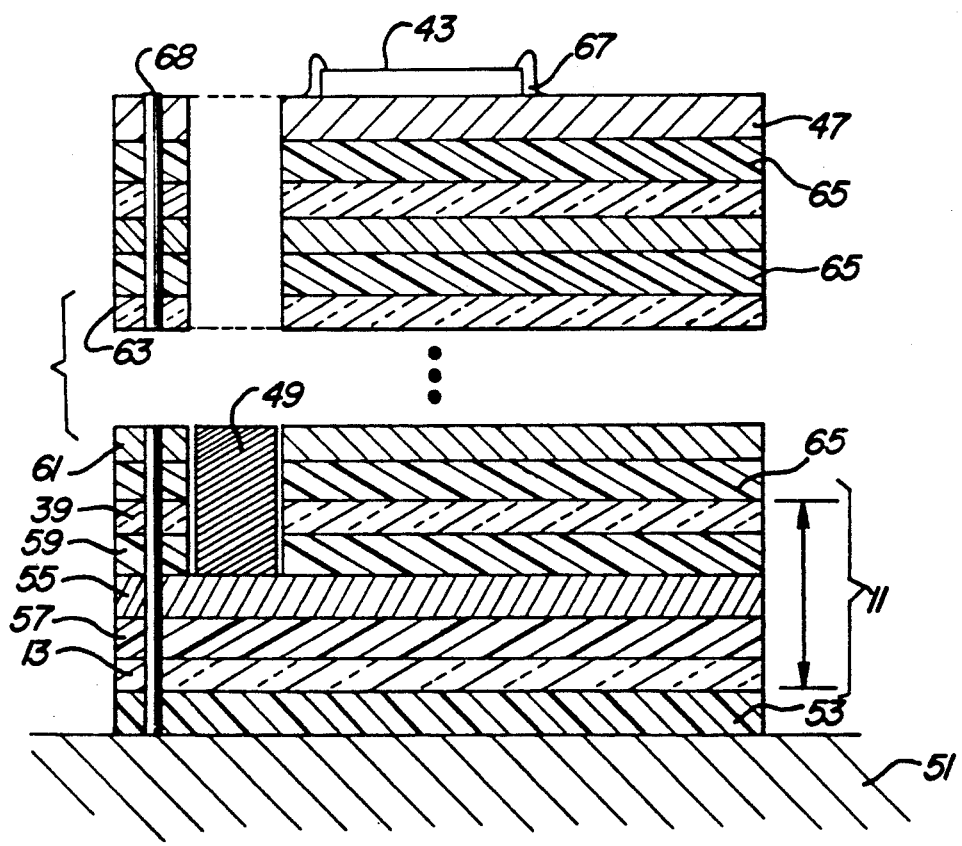
FIG. 3 is a cross sectional view of the layers in FIGS. 1 and 2.

Referring to FIG. 3, a cross sectional view of the layers making up the strain and crack gauge system 41 of the present invention are illustrated mounted atop an aircraft structural surface, whose surface is to be monitored, and designated with the numeral 51. The dielectric bottom layer 13, as was shown in FIG. 1, is shown attached to the aircraft structural surface 51 by a layer of structural adhesive 53, typically an epoxy adhesive.

The layers of planar crack sensing and strain sensing traces are represented collectively as sensor layer 55, and shown attached to dielectric bottom layer 13 with a structural adhesive layer 57, typically a cast thermosetting epoxy. A further non-structural adhesive layer 59 attaches the dielectric top layer 39 to the sensor layer 55. Thus far, the strain gauge 11 of FIG. 2 has been fully described in a layered manner, attached to an aircraft structural surface 51 by a layer of structural adhesive 53.

Above the strain gauge 11 are successively mounted layers of interconnecting sheet layers 61 and dielectric layers 63 joined by successive layers of non-structural adhesive 65. Alternating layers of interconnecting sheet layers 61 and dielectric layers 63 joined by successive layers of non-structural adhesive 65 are added sufficient to effectively attenuate any stress forces, and forces directly from the strain and cracks, from traveling upward from the aircraft structural surface 51.

The interconnecting sheet layers 61 may be used to connect the terminals 15, 17, 19, 27 and 37, and the acoustic emission device 49 to the integrated circuit 43 atop the Conformal Circuit for Structural Health Monitoring system 41 visible in both FIGS. 2 and 3. The interconnecting sheet layers 61 may be used to connect one or more of the acoustic emission devices 49. Note that with respect to each interconnect sheet layer 61, it is attached at its lower side to a dielectric layer 63 and abuts a dielectric layer 63 immediately above it. The interconnecting sheet layers may have traces running across its surface or about its periphery.

An important factor is the interconnection of terminals 15, 16, 17, 19, 27 & 37, and the acoustic emission device 49 with a proper set of conductors 67 leading into the integrated circuit atop the Conformal Circuit for Structural Health Monitoring system 41 of the present invention. The conformal circuit to integrated circuit connection 67 and sensor layer to signal layer interconnection 68 may be accomplished by any method such as wire bonding, shielded connectors, insulated connectors, plated through-hole vias, plated blind hole vias, tape automated bonding, solder or conductive epoxy to name a few. Acoustic emission devices 49 may be interconnected to the integrated circuit 43 using any of the same methods mentioned above. The acoustic emission device 49 may be visible from the surface of system 41 as shown in FIGS. 2 and 3 or may be embedded within the circuit layers. The acoustic emission device 49 requires the same degree of protection from the ambient environment as integrated circuit 43. Acoustic emission devices 49 may be protected by conformal coatings, hermetic enclosures and other methods. As shown in FIG. 2, after a sufficient number of alternating layers of interconnect sheet layers 61 and dielectric layers 63 are added to attenuate the upward travel of the stress forces, the top layer of metalization 47 is secured with a layer of nonstructural adhesive, and forms a mounting surface, support for connection 67, and shield for integrated circuit 43.

In the operation of the strain and crack gauge 11 of the present invention, the sensor layer 55, and the associated traces 29, 31 and 33 undergo cross sectional reducing tension or cross sectional increasing compression associated with the aircraft structural surface 51. The change in resistance with the change in length of the traces 29, 31, and 33 is associated with a quantity known as a gauge factor. The gauge factor is defined by the following equation:

$$\text{Gauge Factor} = \frac{\Delta R / \Delta L}{R / L}$$

where R is the base resistance, ideally about 350 ohms, R is the change in resistance for a given change in length of any given trace, L is the base, un-tensioned and uncompressed, length of a trace, and L is the change in the length of the trace due to compression or tension in a direction generally parallel to current flow. A typical gauge factor for the strain and crack gauge of the present invention is about 2.09. The assumptions of this quantity include the assumption that elastic modulus in compression equals elastic modulus in tension, i.e. a given force, whether in tension or compression, produces the same change in trace cross sectional area. Again, the gauge factor is useful, especially in conjunction with structural parameters of the aircraft surface 51, or any other surface with which the Conformal Circuit for Structural Health Monitoring system 41 of the present invention is utilized.

The Conformal Circuit for Structural Health Monitoring system 41 of the present invention enables the replacement of conventional structural monitoring techniques with a network of acoustic emission, crack and strain sensors embodied in system 41 which will cover large areas of the structure to be monitored. The system 41 may be linked to form a multiple sensor system, to facilitate an integrated airborne structural health monitoring system for an entire structure.

The sensors are interconnected to collocated processor elements or microprocessors for analyzing the signals from the sensors. The sensors may be integrated into a larger system whose installation is simplified by the invention's unique connectorized features. The flexible sensor layer 55 allows conformal installation and attachment to the many different contours found in pressure vessels, statically and dynamically loaded structures, such as, but not limited to aircraft structures, piping systems, buildings and reactor structures.

A single unit installation incorporating multiples of similar or different sensors in one circuit will have the capability to monitor a larger area of structure. The greater the size of area monitored, the greater likelihood of detection of relevant defects in the support structure. This invention has application to both electrically and optically controlled sensor and processor structural health monitoring systems.

Local data processing could occur on strain isolated layers of a multi-layer circuit assembly. The invention enables multiple layer circuits, incorporating integrated circuitry, which could provide processing, memory, power and other subsystem functions for complex structural health monitoring sensor requirements. The flexible sensor layer properties and variability of size enables installation in highly complex and space limited structural geometries. The design allows for ease of connectorization to facilitate installation and interconnection with remote subsystems.

As has been shown, the Conformal Circuit for Structural Health Monitoring system 41 of the present invention may be used for monitoring structural performance of airframes, bridges, buildings, piping systems, etc. Monitoring of structural load conditions facilitates early flaw detection prior to a catastrophic structural failure. Commercial, military and civil applications of this device are numerous. For example: the aging commercial aircraft fleet, numbering over 8,000 units, could utilize over one million of these devices as a replacement for costly ground based structural non-destructive test inspections. The Conformal Circuit for Structural Health Monitoring system 41 of the present invention can replace the costly ground based non-destructive test methods such as X-Ray, eddy current and ultrasound inspections.

The foregoing disclosure and description of the invention are illustrative and explanatory thereof, and various changes in the dimensioning, sizes, materials of construction and method for joining the couplers, as in the details of the illustrated construction may be made without departing from the spirit and scope of the invention.

What is claimed is:

1. A structural monitoring system for detecting strain and cracks in a surface comprising:
   at least a first length of planar serpentine trace;
   support means, affixable to a surface, for supporting said at least a first planar serpentine trace and for transmitting strain and crack forces from said surface to said at least a first planar serpentine trace;

circuit means, connected to said at least a first planar serpentine trace, for measuring resistance changes in said at least a first planar serpentine trace; and, protection layer means, affixed to said support means and said at least a first planar serpentine trace, for protecting said at least a first length of serpentine trace and for supporting said circuit means.

2. The structural monitoring system of claim 1 wherein each of said at least a first length of serpentine trace adjacent another said at least a first length of serpentine trace has a different longitudinal orientation.

3. The structural monitoring system of claim 2 wherein each of said at least one length of serpentine trace lies parallel and adjacent to at least one other of said at least one length of serpentine trace.

4. The structural monitoring system of claim 1 wherein said circuit means further comprises: a first connector extending between a first end of each of said at least a first length of planar serpentine trace and said circuit means; and, a second connector extending between a second end of each of said at least one length of planar serpentine trace and said circuit means.

5. The structural monitoring system of claim 4 wherein said first and said second connectors are of the same length.

6. The structural monitoring system of claim 5 wherein said first and said second connectors are made of copper.

7. The structural monitoring system of claim 4 wherein said circuit means further comprises a continuity indicator circuit, for measuring the continuity of each said length of serpentine trace.

8. The structural monitoring system of claim 1 further comprising acoustical monitoring means attached to said support means and connected to said circuit means, for detecting strain and crack forces at said surface.

9. The structural monitoring system of claim 1 further comprising at least a second length of planar serpentine trace and wherein said first length of planar serpentine trace has a different uniform cross sectional area with respect to said second length of serpentine trace.

10. The structural monitoring system of claim 1 in which said at least a first length of planar serpentine trace further comprises:
at least a first length of serpentine strain sensing trace; and,
at least a first length of serpentine crack sensing trace.

11. The structural monitoring system of claim 10 wherein each of said at least a first length of serpentine crack sensing trace has a different uniform cross sectional area.

12. The structural monitoring system of claim 11 further comprising at least a second length of serpentine crack trace and wherein each of said at least a first and second lengths of serpentine crack trace lie parallel and adjacent to each other.

13. The structural monitoring system of claim 12 wherein said circuit means further comprises a continuity indicator circuit, for measuring the continuity of each said length of serpentine crack trace.

14. The structural monitoring system of claim 10, further comprising at least a second length of serpentine strain sensing trace and wherein each, of said at least a first and second length of serpentine strain sensing traces which are adjacent each other, has a different longitudinal orientation.

15. The structural monitoring system of claim 14 wherein said at least a first and second length of serpentine strain sensing traces adjacent each other and having a different longitudinal orientation forms a cluster, and further comprising a plurality of said clusters.

16. The structural monitoring system for detecting strain and cracks in a surface as recited in claim 1 wherein said at least a first length of serpentine crack sensing trace is made of copper.

17. The structural monitoring system for detecting strain and cracks in a surface as recited in claim 1 wherein each of said at least a first length of serpentine trace, has a resistance of about 300 ohms.

18. A structural monitoring system for detecting strain and cracks in an aircraft surface comprising:
a plurality of planar strain sensing serpentine traces, each having a different longitudinal orientation;
dielectric support means having a first side for fixably supporting said plurality of planar serpentine traces and a second side attached to said aircraft surface, for supporting said plurality of planar serpentine traces and transmitting strain and crack forces from said aircraft surface to said plurality of planar serpentine traces;
dielectric cover means attached to said first side of said dielectric support means and said plurality of planar serpentine traces, for protecting said plurality of planar serpentine traces;
a plurality of dielectric layers and interconnect layers stacked in an alternating manner sufficient to attenuate the transmission of strain and crack forces to a top dielectric layer farthest from said plurality of planar serpentine traces; and,
circuit means, connected to said plurality of planar strain sensing serpentine traces and supported by said top dielectric layer, for measuring resistance changes in said plurality of serpentine traces resulting from the transmitted strain and crack forces emanating from said aircraft surface.

19. The structural monitoring system of claim 18 wherein said circuit means is also for detecting continuity, and wherein said structural monitoring system further comprises:
at least one length of planar crack sensing serpentine trace connected to said circuit means, each having a different uniform cross sectional area and each lying parallel and adjacent to each other.

20. A method for detecting the presence of strain and cracks in a surface comprising the steps of:
using at least one length of planar serpentine trace between two layers of a dielectric material capable of transmitting strain and crack forces from said surface to said planar serpentine trace, to form a strain and crack detector having a first side and a second side;
applying, to a first side of said strain and crack detector, a multiplicity of dielectric layers and interconnect layers in an alternating manner sufficient to attenuate the transmission of strain and crack forces to a top dielectric layer farthest from said at least one length of planar serpentine trace;
applying to said top dielectric layer a metallic circuit support layer for support and shielding;
mounting an integrated circuit having input terminals to said circuit support layer;
connecting said input terminals of said integrated circuit to said at least one length of planar serpentine trace; and,
fixably applying the second side of said strain and crack detector to an aircraft surface whose strain and crack characteristics are to be monitored; and,
operating said integrated circuit to monitor resistance changes in the said at least one length of planar serpentine trace to thereby provide an indication of the strain and crack in said aircraft surface.

* * * * *